United States Patent
Hamada (10) Patent No.: US 8,122,851 B2
(45) Date of Patent: Feb. 28, 2012

(54) TEMPERATURE MEASUREMENT IN A SUBSTRATE PROCESSING APPARATUS

(75) Inventor: Tetsuya Hamada, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 524 days.

(21) Appl. No.: 12/267,267

(22) Filed: Nov. 7, 2008

(65) Prior Publication Data

US 2009/0120362 A1 May 14, 2009

(30) Foreign Application Priority Data

Nov. 13, 2007 (JP) ................................. 2007-294343

(51) Int. Cl.
*B05C 5/02* (2006.01)

(52) U.S. Cl. .......... 118/712; 118/66; 396/571; 396/572; 396/604; 396/611; 374/166; 414/222.01

(58) Field of Classification Search .................. 118/686, 118/712, 664, 66, 52, 56, 319, 320; 427/8; 396/611, 604, 571, 572, 575; 340/870.17; 374/163, 166; 134/902; 414/222.01
See application file for complete search history.

(56) References Cited

U.S. PATENT DOCUMENTS 3,431,392 A * 3/1969 Garland et al. ............... 219/210
2003/0213431 A1 * 11/2003 Fukutomi et al. ............ 118/696
2004/0177927 A1 * 9/2004 Kikuchi et al. ........... 156/345.51
2006/0174720 A1 * 8/2006 Renken et al. ............... 73/866.1

FOREIGN PATENT DOCUMENTS

JP 2004-140167 5/2004
JP 2004140167 A * 5/2004

OTHER PUBLICATIONS

Translation of JP 2004140167 A.*

* cited by examiner

*Primary Examiner* — Laura Edwards
(74) *Attorney, Agent, or Firm* — Kilpatrick Townsend & Stockton LLP (57) ABSTRACT

A substrate processing apparatus is configured to provide in series a plurality of processing blocks, each block including a processing unit and a transport robot transporting a substrate. A substrate rest is provided in a connecting portion of adjacent processing blocks. A sensor plate with sensor coils is provided spanning over support pins of the substrate rest. Once a temperature-measurement substrate with temperature-measuring elements, each element formed by connecting a coil to a quartz resonator, is placed on the support pins, a transmitter-receiver transmits transmission waves corresponding to the characteristic frequencies of the quartz resonators to the temperature-measuring elements through the sensor coils. After the stop of the transmission, the transmitter-receiver receives electromagnetic waves from the temperature-measuring elements through the sensor coils, and the temperature computer computes the substrate temperature based on the frequencies of the electromagnetic waves.

13 Claims, 9 Drawing Sheets

TEMPERATURE MEASUREMENT IN A SUBSTRATE PROCESSING APPARATUS

CROSS-REFERENCES TO RELATED APPLICATIONS

This application claims priority to Japanese Patent Application 2007-194343, filed Nov. 13, 2007. The disclosure of JP 2007-294343 is incorporated by reference in its entirety for all purposes.

BACKGROUND OF THE INVENTION

The invention relates to a substrate processing apparatus that performs given processing such as resist coating and developing on substrates such as semiconductor substrates, glass substrates for liquid crystal displays, glass substrates for photomasks, and substrates for optical disks.

As is generally known, products such as semiconductors and liquid crystal displays are manufactured through a series of processes, such as cleaning, resist coating, exposure, developing, etching, formation of an interlayer insulation film, heat treatment, and dicing, on substrates as described above. U.S. Patent Application Publication No. 2003/0213434 discloses a substrate processing apparatus (what is called a coater-and-developer) that incorporates a plurality of processing units for performing, for example, resist coating, developing, and their accompanying heat treatments, out of the processes described above, and performs a series of photolithographic processes on substrates while transporting the substrates into circulation among those processing units using transport robots.

Such a substrate processing apparatus needs to derive appropriate processing conditions for each processing unit in order to achieve desired results. Even after deriving the processing conditions, the apparatus also needs to check, as necessary, whether the initial setting conditions work properly without causing any processing problem.

Referring to the substrate temperature which is one of the important factors in the processing conditions, Japanese Patent Application Laid-open No. 2004-140167 has suggested a technique for measuring the temperature using damped oscillations caused by the resonance of quartz resonators, mounted on a substrate for temperature measurement, at their characteristic frequencies. Quartz resonators have high heat resistance and high heat sensitivity so that high-precision temperature measurements are possible even with high-temperature substrates.

Such a conventional technique, however, has difficulty in real-time temperature measurement of a substrate being processed, so it was necessary to process substrates in practical use over and over and check the processing results in order to derive appropriate processing conditions. The difficulty in the real-time temperature measurement makes it considerably difficult to detect the occurrence of any processing problem at an early stage.

Use of the temperature-measuring technique disclosed in Japanese Patent Application Laid-open No. 2004-140167 allows a certain degree of real-time temperature measurement of a substrate being processed; however, equipping each processing unit with various mechanisms such as sensor coils that accompany the temperature measurement not only complicates the configuration of each processing unit but also brings about various adverse effects on processes and maintenance.

SUMMARY OF THE INVENTION

The invention is directed to a substrate processing apparatus performing given processing on a substrate.

According to an embodiment of the invention, the substrate processing apparatus includes: a plurality of processing blocks provided in series in one direction and each including a processing unit performing processing on a substrate and a transport robot transporting a substrate to the processing unit; a substrate rest which is provided in a connecting portion of the plurality of processing blocks and on which a substrate is placed for transfer of the substrate between the transport robots of each adjacent pair of the plurality of processing blocks; a sensor coil provided in the substrate rest and for use in radio transmission and reception to and from a temperature-measuring element that is formed by connecting a coil or antenna to a quartz resonator; a transmitter-receiver that, once a temperature-measurement substrate with the temperature-measuring element is placed on the substrate rest, transmits a transmission wave to the temperature-measuring element through the sensor coil, and after stopping the transmission of the transmission wave, receives an electromagnetic wave from the temperature-measuring element through the sensor coil; and a temperature computer for computing a temperature of the temperature-measurement substrate based on a frequency of the electromagnetic wave that the transmitter-receiver receives from the temperature-measuring element.

The substrate rest in a connecting portion of the processing blocks is provided with the sensor coil. Once the temperature-measurement substrate with the temperature-measuring element is placed on the substrate rest, a transmission wave is transmitted to the temperature-measuring element through the sensor coil. After the transmission of the transmission wave stops, an electromagnetic wave is received from the temperature-measuring element through the sensor coil; and the temperature of the temperature-measurement substrate is computed based on the frequency of the electromagnetic wave received from the temperature-measuring element. This allows high-precision and real-time temperature measurement of a substrate being processed, without complicating the configuration of the apparatus.

Preferably, the substrate rest includes a plurality of support pins for use in placement of a substrate, and the sensor coil is annexed to the plurality of support pins.

The annexation of the sensor coil to the support pins of the substrate rest further simplifies the configuration of the apparatus.

According to another embodiment of the invention, the substrate processing apparatus includes: first and second transport robots each transporting a substrate to a plurality of substrate transfer positions; a substrate rest on which a substrate is placed for transfer of the substrate between the first and second transport robots; a sensor coil provided in the substrate rest for use in radio transmission and reception to and from a temperature-measuring element that is formed by connecting a coil or antenna to a quartz resonator; a transmitter-receiver that, once a temperature-measurement substrate with the temperature-measuring element is placed on the substrate rest, transmits a transmission wave to the temperature-measuring element through the sensor coil, and after stopping the transmission of the transmission wave, receives an electromagnetic wave from the temperature-measuring element through the sensor coil; and a temperature computer for computing a temperature of the temperature-measurement substrate based on a frequency of the electromagnetic wave that the transmitter-receiver receives from the temperature-measuring element.

The substrate rest on which a substrate is placed for transfer of the substrate between the first and second transport robots is provided with the sensor coil. Once the temperature-measurement substrate with the temperature-measuring element is placed on the substrate rest, a transmission wave is transmitted to the temperature-measuring element through the sensor coil. After the transmission of the transmission wave stops, an electromagnetic wave is received from the temperature-measuring element through the sensor coil; and the temperature of the temperature-measurement substrate is computed based on the frequency of the electromagnetic wave received from the temperature-measuring element. This allows high-precision and real-time temperature measurement of a substrate being processed, without complicating the configuration of the apparatus.

An object of the invention is thus to achieve high-precision and real-time temperature measurement of a substrate being processed, without complicating the configuration of the apparatus.

These and other objects, features, aspects and advantages of the present invention will become more apparent from the following detailed description of the present invention when taken in conjunction with the accompanying drawings.

DETAILED DESCRIPTION OF THE INVENTION

Embodiments of the invention are hereafter described in detail with reference to the drawings.

Overall Configuration of Substrate Processing Apparatus

Figure 1:
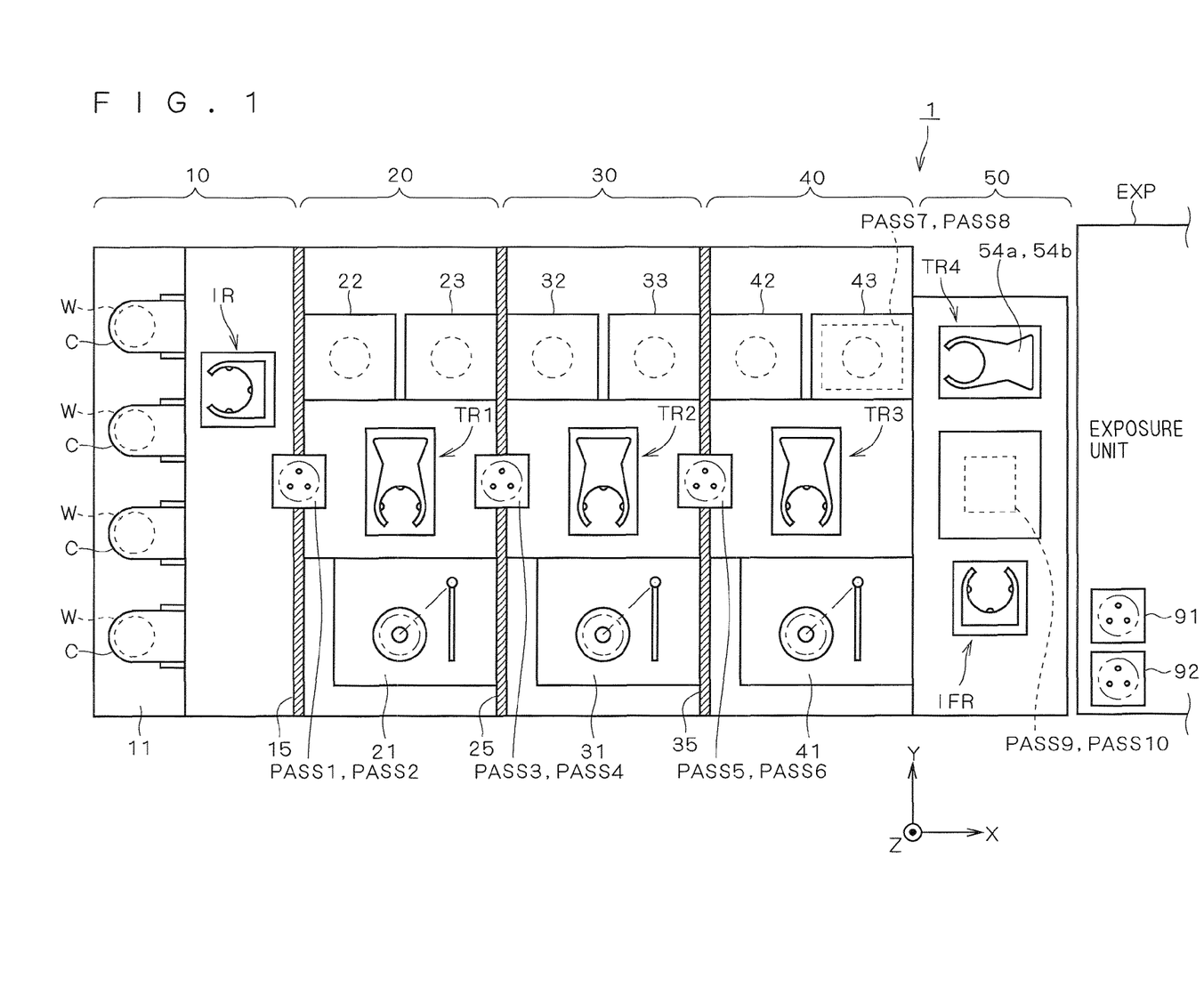
FIG. 1 is a plan view of a substrate processing apparatus according to an embodiment of the invention.
Figure 2:
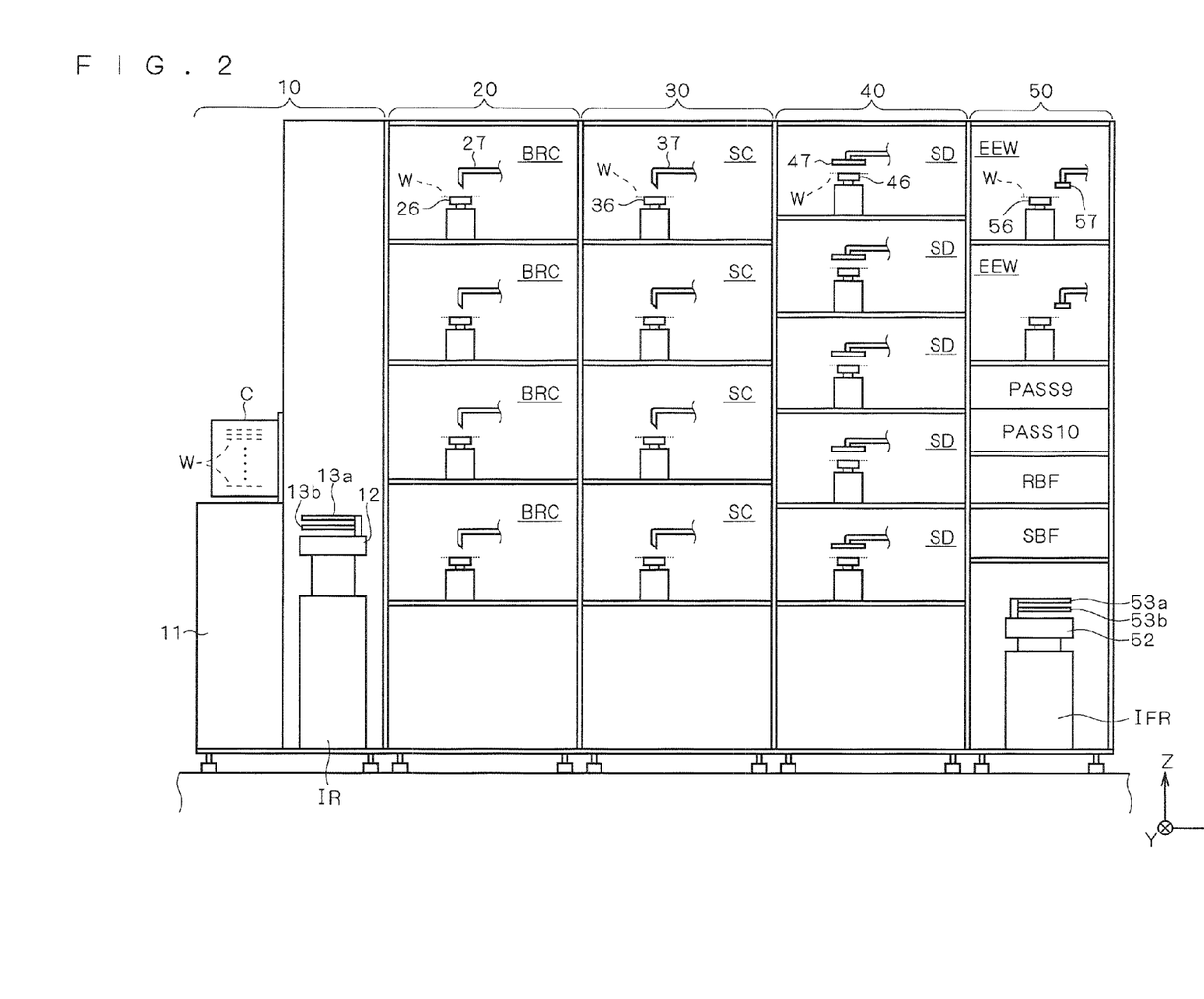
FIG. 2 is a front view of liquid processing units in the substrate processing apparatus in FIG. 1.
Figure 3:
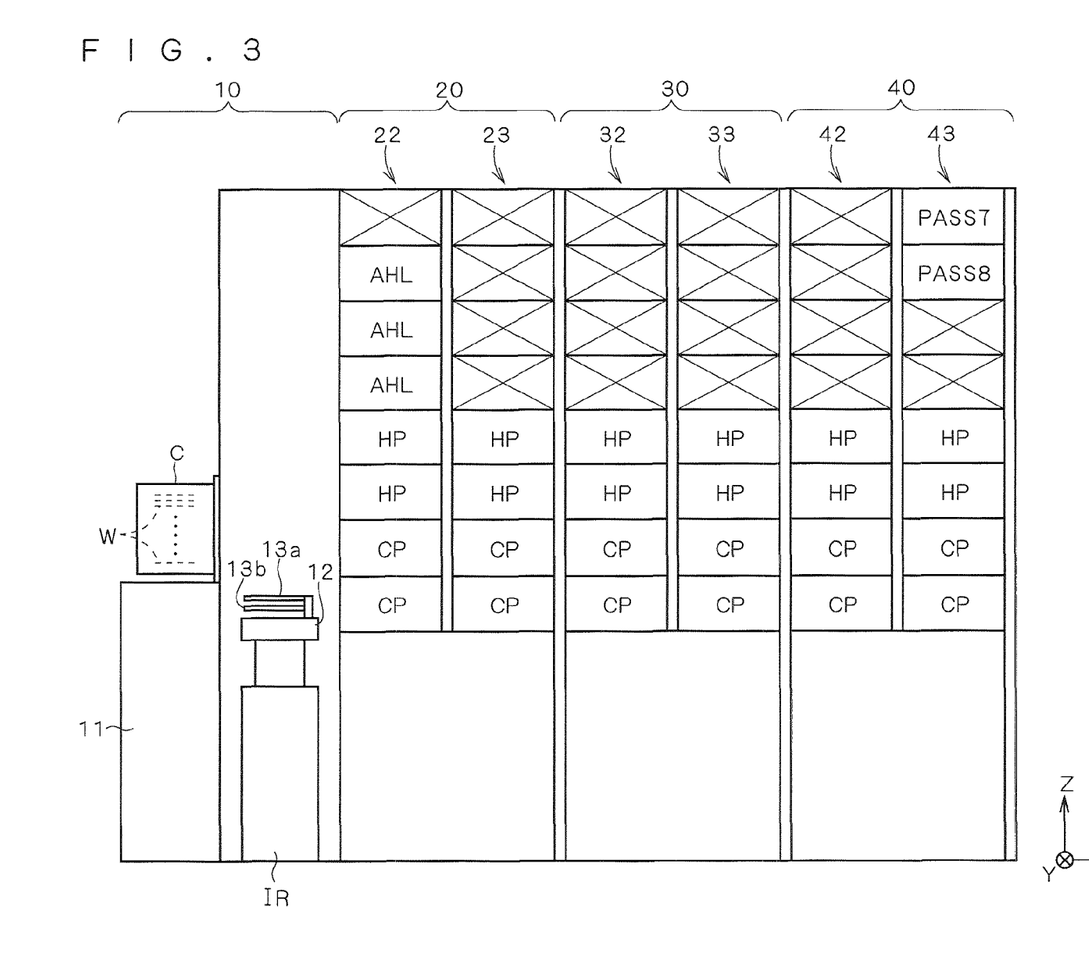
FIG. 3 is a front view of heat-treatment units in the substrate processing apparatus in FIG. 1.
Figure 4:
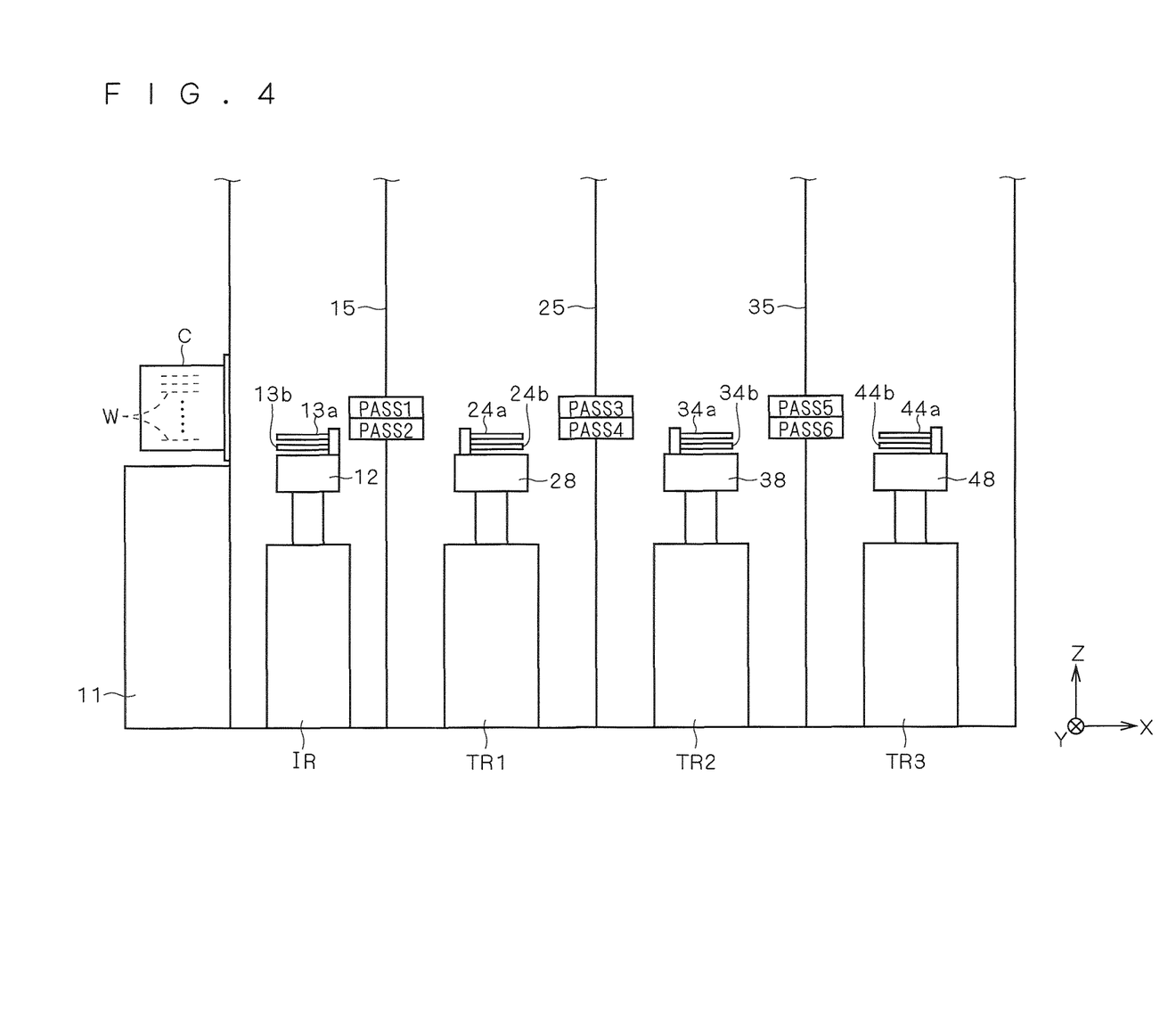
FIG. 4 illustrates a configuration of transport robots and substrate rests in the substrate processing apparatus in FIG. 1.

First, an overall configuration of a substrate processing apparatus according to one embodiment is described. FIG. 1 is a plan view of a substrate processing apparatus 1 according to the embodiment. FIG. 2 is a front view of liquid processing units in the substrate processing apparatus 1; FIG. 3 is a front view of heat-treatment units; and FIG. 4 illustrates a configuration of transport robots and substrate rests. In order to clarify the relation of the figures, FIG. 1 and subsequent figures additionally show, as appropriate, an XYZ rectangular coordinate system where the Z-axis direction shall be a vertical direction and the XY plane shall be a horizontal plane.

The substrate processing apparatus 1 of the present embodiment is an apparatus (what is called a coater-and-developer) that applies and forms a coating of photoresist film on substrates W, such as semiconductor wafers, and develops pattern-exposed substrates W. Substrates W to be processed by the substrate processing apparatus 1 are not limited to semiconductor wafers; they may be glass substrates for liquid crystal displays, glass substrates for photomasks, or the like.

The substrate processing apparatus 1 of the present embodiment includes five blocks, namely an indexer block 10, a BARC block 20, a resist-coating block 30, a development block 40, and an interface block 50, which are provided in series in one direction (in the X direction). Of these blocks, the BARC block 20, the resist-coating block 30, and the development block 40 are processing blocks each of which includes a processing unit performing processing on substrates W and a transport robot transporting substrates W to the processing unit. The "processing units" include heat-treatment units (such as heating units HP, cooling units CP, and adhesion-promoting units AHL, which will be described later) that perform heat treatments on substrates W and liquid processing units (such as coating units BRC and SC and development units SD) that process substrates W with the supply of a liquid, and in addition, they are used to refer collectively to such units that perform given processing on substrates W.

The series of those processing blocks (the BARC block 20, the resist-coating block 30, and the development block 40) is connected at one end (the −X-side end) to the indexer block 10 and at the other end (the +X-side end) to the interface block 50. The interface block 50 is then connected to an exposure unit (stepper) EXP which is a separate external device from the substrate processing apparatus 1. In other words, the interface block 50 is located between the other end of the series of the three processing blocks and the exposure unit EXP.

The indexer block 10 is a block that transports unprocessed substrates received from outside the apparatus into the apparatus and transports processed substrates that have undergone development, out of the apparatus. The indexer block 10 includes a placing table 11 on which a plurality of (four, in the present embodiment) carriers C are placed side by side; and an indexer robot IR that takes unprocessed substrate W out of each carrier C and stores processed substrates W in each carrier C.

The indexer robot IR includes a movable base 12 that is horizontally movable along the placing table 11 (in the Y-axis direction), vertically movable (in the Z-axis direction), and pivotable about an axis extending in the vertical direction. The movable base 12 is equipped with two holding arms 13a and 13b, each holding a substrate W in a horizontal position. The holding arms 13a and 13b are slidably movable back and forth independently of each other. Each of the holding arms 13a and 13b is thus horizontally movable in the Y-axis direction, vertically movable, pivotable in a horizontal plane, and movable back and forth in the radial direction of the pivot. The indexer robot IR can accordingly cause the holding arms 13a and 13b to access each carrier C independently of each other in order to retrieve unprocessed substrates W and to store processed substrates W. The carriers C may be in the form of FOUPs (front opening unified pods) which store substrates W in an enclosed or sealed space or may be in any other suitable form such as SMIF (standard mechanical interface) pods or OCs (open cassettes) which expose stored substrates W to the atmosphere.

The BARC block 20 is provided adjacent to the indexer block 10. There is a partition wall 15 between the indexer block 10 and the BARC block 20 in order to cut off the atmosphere of one block from the other. This partition wall 15 includes two substrate rests PASS1 and PASS2 which are stacked one above the other in layers and on which substrates W are placed for transfers of the substrates W between the indexer block 10 and the BARC block 20.

The upper substrate rest PASS1 is for use for transport of a substrate W from the indexer block 10 to the BARC block 20. The substrate rest PASS1 includes three support pins, on which the indexer robot IR of the indexer block 10 places an unprocessed substrate W taken out of a carrier C. A substrate W placed on the substrate rest PASS1 is then received by a transport robot TR1 of the BARC block 20 which will be described later. The lower substrate rest PASS2, on the other hand, is for use for transport of a substrate W from the BARC block 20 to the indexer block 10. The substrate rest PASS2 also includes three support pins, on which the transport robot TR1 of the BARC block 20 places a processed substrate W. A substrate W placed on the substrate rest PASS2 is then received and stored in a carrier C by the indexer robot IR. The other substrate rests PASS3 to PASS10 are identical in configuration to the substrate rests PASS1 and PASS2, and their configurations will be described later in detail.

The substrate rests PASS1 and PASS2 are provided passing through part of the partition wall 15. Each of the substrate rests PASS1 and PASS2 is provided with an optical sensor (not shown) that detects the presence or absence of a substrate W Based on a detection signal from each sensor, it is determined whether the indexer robot IR or the transport robot TR1 is allowed to transfer or receive a substrate W to or from the substrate rest PASS1 or PASS2.

Then, the BARC block 20 is described. The BARC block 20 is a processing block that applies and forms a coating of anti-reflection film on a base of photoresist film, in order to reduce standing waves and halation occurring during exposure. The BARC block 20 includes a base-coating part 21 applying and forming a coating of anti-reflection film to the surface of a substrate W; two heat-treatment towers 22 and 23 performing heat treatments accompanying the application and formation of the anti-reflection film coating; and the transport robot TR1 transferring and receiving substrates W to and from the base-coating part 21 and the heat-treatment towers 22 and 23.

In the BARC block 20, the base-coating part 21 is located to face the heat-treatment towers 22 and 23 with the transport robot TR1 in between. More specifically, the base-coating part 21 is located on the front side (−Y side) of the apparatus, and the two heat-treatment towers 22 and 23 are on the rear side (+Y side) of the apparatus. Further, a thermal partition wall, not shown, is provided on the front side of the heat-treatment towers 22 and 23. Spacing the base-coating part 21 and the heat-treatment towers 22 and 23 with the thermal partition wall therebetween prevents the heat-treatment towers 22 and 23 from thermally affecting the base-coating part 21.

As shown in FIG. 2, the base-coating part 21 includes four coating units BRC of the same configuration which are stacked one above another in layers. Each of the coating units BRC includes a spin chuck 26 that rotates a substrate W in approximately a horizontal plane while absorbing and holding the substrate W in approximately a horizontal position; a coating nozzle 27 that applies a coating solution for anti-reflection film onto a substrate W held on the spin chuck 26; a spin motor (not shown) that rotatably drives the spin chuck 26; a cup (not shown) that surrounds a substrate W held on the spin chuck 26; and the like.

As shown in FIG. 3, the heat-treatment tower 22 includes two heating units HP that heat substrates W up to given temperatures; two cooling units CP that cool heated substrates W down to given temperatures and maintain the substrates W at the given temperatures; and three adhesion-promoting units AHL that perform heat treatments on substrates W in an atmosphere of HMDS (hexamethyldisilazane) vapor in order to improve adhesion of the substrates W to a resist film, all of which are stacked one above another in layers. The heat-treatment tower 23 also includes two heating units HP and two cooling units CP, which are stacked one above another in layers. The squares filled with a cross in FIG. 3 designate either a space allotted to piping and wiring or a spare empty space (the same applies to the other heat-treatment towers which will be described later).

As shown in FIG. 4, the transport robot TR1 includes two transport arms 24a and 24b which are closely spaced one above the other in tiers and each of which holds a substrate W in approximately a horizontal position. Each of the transport arms 24a and 24b has a C-shaped end portion in plan view and supports the edge of a substrate W from below with a plurality of pins that protrude inward from inside the C-shaped end portion. The transport arms 24a and 24b are mounted on a transport head 28. The transport head 28 is movable up and down in the vertical direction (in the Z-axis direction) and pivotable about an axis extending in the vertical direction, using a drive mechanism not shown. The transport head 28 can also independently move each of the transport arms 24a and 24b back and forth in the horizontal direction, using a sliding mechanism not shown. Each of the transport arms 24a and 24b is thus vertically movable, pivotable in a horizontal plane, and movable back and forth in the radial direction of the pivot. The transport robot TR1 can accordingly cause each of the two transport arms 24a and 24b to independently access the substrate rests PASS1 and PASS2, the heat-treatment units (the heating units HP, the cooling units CP, and the adhesion-promoting units AHL) in the heat-treatment towers 22 and 23, the four coating units BRC in the base-coating part 21, and the substrate rests PASS3 and PASS4 which will be described later, to thereby transfer and receive substrates W thereto and therefrom.

Then, the resist-coating block 30 is described. The resist-coating block 30 is provided so as to be sandwiched between the BARC block 20 and the development block 40. There is a partition wall 25 between the resist-coating block 30 and the BARC block 20 in order to cut the atmosphere of one block from the other. This partition wall 25 includes two substrate rests PASS3 and PASS4 which are stacked one above the other in layers and on which substrates W are placed for transfer of the substrates W between the BARC block 20 and the resist-coating block 30. The substrate rests PASS3 and PASS4 are identical in configuration to the substrate rests PASS1 and PASS2 described above.

The upper substrate rest PASS3 is for use for transport of a substrate W from the BARC block 20 to the resist-coating block 30. Specifically, a substrate W placed on the substrate rest PASS3 by the transport robot TR1 of the BARC block 20 is received by a TR2 of the resist-coating block 30. The lower substrate rest PASS4, on the other hand, is for use for transport of a substrate W from the resist-coating block 30 to the BARC block 20. Specifically, a substrate W placed on the substrate rest PASS4 by the transport robot TR2 of the resist-coating block 30 is received by the transport robot TR1 of the BARC block 20.

The substrate rests PASS3 and PASS4 are provided passing through part of the partition wall 25. Each of the substrate rests PASS3 and PASS4 is provided with an optical sensor (not shown) that detects the presence or absence of a substrate W. Based on a detection signal from each sensor, it is determined whether the transport robot TR1 or TR2 is allowed to transfer or receive a substrate W to or from the substrate rest PASS3 or PASS4.

The resist-coating block 30 is a processing block that applies a resist onto an anti-reflection-film-coated substrate W to form a resist film. The present embodiment employs a chemically amplified resist as a photoresist. The resist-coating block 30 includes a resist-coating part 31 applying a resist coating onto a base-coated anti-reflection film; two heat-treatment towers 32 and 33 performing heat treatments accompanying the resist coating; and the transport robot TR2 transferring and receiving substrates W to and from the resist-coating part 31 and the heat-treatment towers 32 and 33.

In the resist-coating block 30, the resist-coating part 31 is located to face the heat-treatment towers 32 and 33 with the transport robot TR2 in between. More specifically, the resist-coating part 31 is located on the front side of the apparatus, and the two heat-treatment towers 32 and 33 are on the rear side of the apparatus. Then, a thermal partition wall, not shown, is provided on the front side of the heat-treatment towers 32 and 33. Spacing the resist-coating part 31 and the heat-treatment towers 32 and 33 with the thermal partition wall therebetween prevents the heat-treatment towers 32 and 33 from thermally affecting the resist-coating part 31.

As shown in FIG. 2, the resist-coating part 31 includes four coating units SC of the same configuration which are stacked one above another in layers. Each of the coating units SC includes a spin chuck 36 that rotates a substrate W in approximately a horizontal plane while absorbing and holding the substrate W in approximately a horizontal position; a coating nozzle 37 that applies a coating solution of photoresist onto a substrate W held on the spin chuck 36; a spin motor (not shown) that rotatably drives the spin chuck 36; a cup (not shown) that surrounds a substrate W held on the spin chuck 36; and the like.

As shown in FIG. 3, the heat-treatment tower 32 includes two heating units HP that heat substrates W up to given temperatures; and two cooling units CP that cool heated substrates W down to given temperatures and maintain the substrates W at the given temperatures, all of which are stacked one above another in layers. The heat-treatment tower 33 also includes two heating units HP and two cooling units CP, which are stacked one above another in layers.

As shown in FIG. 4, the transport robot TR2 is identical in configuration to the transport robot TR1 and includes two transport arms 34a and 34b which are closely spaced one above the other in tiers and each of which holds a substrate W in approximately a horizontal position. Each of the transport arms 34a and 34b supports the edge of a substrate W from below with a plurality of pins that protrude inward from inside its C-shaped end portion. The transport arms 34a and 34b are mounted on a transport head 38. The transport head 38 is movable up and down in the vertical direction (in the Z-axis direction) and pivotable about an axis extending in the vertical direction, using a drive mechanism not shown. The transport head 38 can also independently move each of the transport arms 34a and 34b back and forth in the horizontal direction, using a sliding mechanism not shown. Each of the transport arms 34a and 34b is thus vertically movable, pivotable in a horizontal plane, and movable back and forth in the radial direction of the pivot. The transport robot TR2 can accordingly cause each of the two transport arms 34a and 34b to independently access the substrate rests PASS3 and PASS4, the heat-treatment units in the heat-treatment towers 32 and 33, the four coating units SC in the resist-coating part 31, and the substrate rests PASS5 and PASS6 which will be described later, to thereby transfer and receive substrates W thereto and therefrom.

Then, the development block 40 is described. The development block 40 is provided so as to be sandwiched between the resist-coating block 30 and the interface block 50. There is also a partition wall 35 between the development block 40 and the resist-coating block 30 in order to cut off the atmosphere of one block from the other. This partition wall 35 includes the two substrate rests PASS5 and PASS6 which are stacked one above the other in layers and on which substrates W are placed for transfer of the substrates W between the resist-coating block 30 and the development block 40. The substrate rests PASS5 and PASS6 are identical in configuration to the substrate rests PASS1 and PASS2 described above.

The upper substrate rest PASS5 is for use for transport of a substrate W from the resist-coating block 30 to the development block 40. Specifically, a substrate W placed on the substrate rest PASS5 by the transport robot TR2 of the resist-coating block 30 is received by a transport robot TR3 of the development block 40. The lower substrate rest PASS6, on the other hand, is for use for transport of a substrate W from the development block 40 to the resist-coating block 30. Specifically, a substrate W placed on the substrate rest PASS6 by the transport robot TR3 of the development block 40 is received by the transport robot TR2 of the resist-coating block 30.

The substrate rests PASS5 and PASS6 are provided passing through part of the partition wall 35. Each of the substrate rests PASS5 and PASS6 is provided with an optical sensor (not shown) that detects the presence or absence of a substrate W. Based on a detection signal from each sensor, it is determined whether the transport robot TR2 or TR3 is allowed to transfer or receive a substrate W to or from the substrate rest PASS5 or PASS6.

The development block 40 is a processing block that performs development on substrates W that have undergone exposure. The development block 40 includes a development part 41 performing development with the supply of a developer to a pattern-exposed substrate W; a heat-treatment tower 42 performing a heat treatment after development; a heat-treatment tower 43 performing a heat treatment on a just-exposed substrate W; and the transport robot TR3 transferring and receiving substrates W to and from the development part 41 and the heat-treatment tower 42.

As shown in FIG. 2, the development part 41 includes five development units SD of the same configuration which are stacked one above another in layers. Each of the development units SD includes a spin chuck 46 that rotates a substrate W in approximately a horizontal plane while absorbing and holding the substrate W in approximately a horizontal position; a nozzle 47 that supplies a developer onto a substrate W held on the spin chuck 46; a spin motor (not shown) that rotatably drives the spin chuck 46; a cup (not shown) that surrounds a substrate W held on the spin chuck 46; and the like.

As shown in FIG. 3, the heat-treatment tower 42 includes two heating units HP that heat substrates W up to given temperatures; and two cooling units CP that cool heated substrates W down to given temperatures and maintain the substrates W at the given temperatures, all of which are stacked one above another in layers. The heat-treatment tower 43 also includes two heating units HP and two cooling units CP, which are stacked one above another in layers. The heating units HP in the heat-treatment tower 43 perform post-exposure baking on just-exposed substrates W. Transport of substrates W into and out of the heating units HP and the cooling units CP in the heat-treatment tower 43 are carried out by a transport robot TR4 of the interface block 50.

The heat-treatment tower 43 further incorporates two substrate rests PASS7 and PASS8 which are closely stacked one above the other, for transfer of substrates W between the development block 40 and the interface block 50. The upper substrate rest PASS7 is for use for transport of a substrate W from the development block 40 to the interface block 50. Specifically, a substrate W placed on the substrate rest PASS7 by the transport robot TR3 of the development block 40 is received by the transport robot TR4 of the interface block 50. The lower substrate rest PASS8, on the other hand, is for use for transport of a substrate W from the interface block 50 to the development block 40. Specifically, a substrate W placed on the substrate rest PASS8 by the transport robot TR4 of the interface block 50 is received by the transport robot TR3 of the development block 40. The substrate rests PASS7 and PASS8 are open to both the transport robot TR3 of the development block 40 and the transport robot TR4 of the interface block 50.

The transport robot TR3 includes transport arms 44a and 44b which are closely spaced one above the other and each of which holds a substrate W in approximately a horizontal position. Each of the transport arms 44a and 44b supports the edge of a substrate W from below with a plurality of pins that protrude inward from inside its C-shaped end portion. The transport arms 44a and 44b are mounted on a transport head 48. The transport head 48 is movable up and down in the vertical direction (in the Z-axis direction) and pivotable about an axis extending in the vertical direction, using a drive mechanism not shown. The transport head 48 can also independently move each of the transport arms 44a and 44b back and forth in the horizontal direction, using a sliding mechanism not shown. Each of the transport arms 44a and 44b is thus vertically movable, pivotable in a horizontal plane, and movable back and forth in the radial direction of the pivot. The transport robot TR3 can accordingly cause each of the two transport arms 44a and 44b to independently access the substrate rests PASS5 and PASS6, the heat-treatment units in the heat-treatment tower 42, the five development units SD in the development part 41, and the substrate rests PASS7 and PASS8 in the heat-treatment tower 43, to thereby transfer and receive substrates W thereto and therefrom.

Then, the interface block 50 is described. The interface block 50 is a block that is located adjacent to the development block 40 and that transfers resist-film-coated but unexposed substrates W to the exposure unit EXP, which is a separate external device from the substrate processing apparatus 1, and receives exposed substrates W from the exposure unit EXP and transfers the substrates W to the development block 40. The interface block 50 includes, in addition to a transport mechanism IFR for transfer of substrates W to and from the exposure unit EXP, two edge-exposing units EEW that expose edge portions of resist-film-coated substrates W; and the transport robot TR4 that transfers and receives substrates W to and from the heat-treatment tower 43 in the development block 40 and the edge-exposure units EEW.

Each of the edge-exposing units EEW, as shown in FIG. 2, includes a spin chuck 56 that rotates a substrate W in approximately a horizontal plane while absorbing and holding the substrate W in approximately a horizontal position, a light emitter 57 that applies light to the edge of a substrate W held on the spin chuck 56, and the like. The two edge-exposing units EEW are stacked one above the other in layers in the middle portion of the interface block 50. On the underside of the edge-exposing units EEW, two substrate rests PASS9 and PASS10, a return buffer RBF for putting a substrate back, and a send buffer SBF for feeding a substrate are stacked one above another in layers. The upper substrate rest PASS9 is for use for transfer of a substrate W from the transport robot TR4 to the transport mechanism IFR, and the lower substrate rest PASS10 is for use for transfer of a substrate W from the transport mechanism IFR to the transport robot TR4.

The return buffer RBF is where, when the development block 40 cannot develop exposed substrates W due to some sort of problems, the substrates W are temporarily stored after post-exposure heating in the heat-treatment tower 43 in the development block 40. The send buffer SBF, on the other hand, is where, when the exposure unit EXP is unable to receive unexposed substrates W, the substrates W prior to exposure are temporarily stored. Each of the return buffer RBF and the send buffer SBF is configured as storage shelves that provide multi-tier storage for a plurality of substrates W. The return buffer RBF is accessed by the transport robot TR4, while the send buffer SBF is accessed by the transport mechanism IFR.

The transport robot TR4, which is located adjacent to the heat-treatment tower 43 in the development block 40, includes transport arms 54a and 54b which are closely spaced one above the other and each of which holds a substrate W in approximately a horizontal position; it is identical in configuration and operating mechanisms to the transport robots TR1 to TR3. The transport mechanism IFR includes a movable base 52 which is horizontally movable in the Y-axis direction, vertically movable, and pivotable about an axis extending in the vertical direction and on which two holding arms 53a and 53b are mounted, each holding a substrate W in a horizontal position. The holding arms 53a and 53b are slidably movable back and forth independently of each other. Each of the holding arms 53a and 53b is thus horizontally movable in the Y-axis direction, vertically movable, pivotable in a horizontal plane, and movable back and forth in the radial direction of the pivot.

The exposure unit EXP performs an exposure process on resist-coated substrates W in the substrate processing apparatus 1. The exposure unit EXP installs, as substrate transfer parts, a run-in table 91 on which a substrate W prior to exposure is placed; and a run-out table 92 on which a substrate W after exposure is placed. Like the substrate rests PASS1 to PASS10, each of the run-in table 91 and the run-out table 92 includes three support pins. The transport mechanism IFR in the interface block 50 places a resist-coated, unexposed substrate W on the run-in table 91 and receives an exposed substrate W placed on the run-out table 92. The exposure unit EXP also includes a transport mechanism (a transport robot) not shown that receives an unexposed substrate W placed on the run-in table 91 and places an exposed substrate W on the run-out table 92. The exposure unit EXP may support what is called an "immersion lithography" in which an exposure process is performed under such a condition that a liquid with a high refractive index (e.g., pure water with a refractive index, n, of 1.44) is filled in a space between a projection optical system and a substrate W.

Procedure in Substrate Processing Apparatus

Next, the procedure of substrate processing in the substrate processing apparatus 1 described above is briefly described. First, unprocessed substrates W stored in a carrier C is transported into the indexer block 10 from outside the apparatus, using an AGV or the like. The indexer block 10 then delivers the unprocessed substrates W. To be more specific, the indexer robot IR takes an unprocessed substrate W out of a given carrier C and places the substrate W on the upper substrate rest PASS1. Once an unprocessed substrate W is placed on the substrate rest PASS1, the transport robot TR1 of the BARC block 20 receives and transports the substrate W to any one of the adhesion-promoting units AHL in the heat-treatment tower 22. The adhesion-promoting unit AHL performs a heat treatment on the substrate W in an atmosphere of HMDS vapor to improve the adhesion properties of the substrate W. The adhesion-promoted substrate W is taken out by the transport robot TR1 and transported to and cooled in any one of the cooling units CP in the heat-treatment towers 22 and 23.

The cooled substrate W is transported by the transport robot TR1 from the cooling unit CP to any one of the coating units BRC in the base-coating part 21. The coating unit BRC applies a coating solution of anti-reflection film to the surface of the substrate W while rotating the substrate W.

After the completion of the coating, the substrate W is transported by the transport robot TR1 to one of the heating units HP in the heat-treatment towers 22 and 23. By heating the substrate W, the heating unit HP dries and bakes the coating solution into a base of anti-reflection film on the substrate W. The substrate W subsequently taken out of the heating unit HP by the transport robot TR1 is transported to and cooled in any one of the cooling units CP in the heat-treatment towers 22 and 23. The cooled substrate W is placed on the substrate rest PASS3 by the transport robot TR1.

Once the anti-reflection-film-coated substrate W is placed on the substrate rest PASS3, the transport robot TR2 of the resist-coating block 30 receives and transports the substrate W to any one of the cooling units CP in the heat-treatment towers 32 and 33, in which then the temperature of the substrate W is regulated to a given temperature. The transport robot TR2 then transports the temperature-controlled substrate W to any one of the coating units SC in the resist-coating part 31. The coating unit SC applies a coating solution of resist film to the substrate W while rotating the substrate W. The present embodiment employs a chemically amplified resist as a resist.

After the completion of the resist coating, the substrate W transported out of the coating unit SC is transported by the transport robot TR2 to any one of the heating units HP in the heat-treatment towers 32 and 33. By heating (post-applied baking) the substrate W, the heating unit HP dries the coating solution to form a resist film on the substrate W. The substrate W is subsequently taken out from the heating unit HP by the TR2 and transported to and cooled in any one of the cooling units CP in the heat-treatment towers 32 and 33. The cooled substrate W is placed on the substrate rest PASS5 by the transport robot TR2.

Once the resist-coated substrate W is placed on the substrate rest PASS5, the transport robot TR3 of the development block 40 receives and places the substrate W as it is on the substrate rest PASS7. The substrate W placed on the substrate rest PASS7 is received by the transport robot TR4 of the interface block 50 and transported into either the upper or lower edge-exposing unit EEW. The edge-exposing unit EEW performs an exposure process (an edge-exposing process) on the edge portion of the substrate W. After the completion of the edge-exposing process, the substrate W is placed on the substrate rest PASS9 by the transport robot TR4. The substrate W placed on the substrate rest PASS9 is then received by the transport mechanism IFR and placed on the run-in table 91 in the exposure unit EXP. In this way, the substrate W transported into the exposure unit EXP is subjected to a pattern-exposing process. Because of the use of chemically amplified resists in the present embodiment, a photochemical reaction will generate acid in the exposed portion of the resist film formed on the substrate W.

The exposed substrate W after the pattern-exposing process is placed on the run-out table 92 in the exposure unit EXP. The transport mechanism IFR receives and returns this substrate W from the exposure unit EXP again to the interface block 50 and then places the substrate W on the substrate rest PASS10. Once the exposed substrate W is placed on the substrate rest PASS10, the transport robot TR4 receives and transports the substrate W to either of the heating units HP in the heat-treatment tower 43. The heating unit HP in the heat-treatment tower 43 performs a post-exposure baking process in which a product resulting from photochemical reactions during exposure is used as an acid catalyst to encourage reactions such as cross-linking and polymerization of resist resins so that the solubility of resists in a developer varies locally only in the exposed portion.

The substrate W after the post-exposure baking process is cooled down by an internal mechanism in the heating unit HP, so that the above chemical reactions come to a stop. The substrate W is subsequently taken out of the heating unit HP in the heat-treatment tower 43 and placed on the substrate rest PASS8 by the transport robot TR4.

Once the substrate W is placed on the substrate rest PASS8, the transport robot TR3 of the development block 40 receives and transports the substrate W to either one of the cooling units CP in the heat-treatment tower 42. In the cooling unit CP, the substrate W after the post-exposure baking is further cooled down and regulated to a given temperature with precision. The transport robot TR3 then takes the substrate W out of the cooling unit CP and transports the substrate W to any one of the development units SD in the development part 41. The development unit SD supplies a developer to the substrate W to encourage development. After the completion of the development, the transport robot TR3 transports the substrate W to either one of the heating units HP in the heat-treatment tower 42 and then to either one of the cooling units CP.

Thereafter, the transport robot TR3 places the substrate W on the substrate rest PASS6. The substrate W placed on the substrate rest PASS6 is placed as it is on the substrate rest PASS4 by the transport robot TR2 of the resist-coating block 30. The substrate W placed on the substrate rest PASS4 is further placed as it is on the substrate rest PASS2 by the transport robot TR1 of the BARC block 20 and then stored in the indexer block 10. The processed substrate W placed on the substrate rest PASS2 is stored in a given carrier C by the indexer robot IR. Thereafter, the carrier C that has stored a given number of processed substrates W is transported out of the apparatus, which completes a series of photolithographic processes.

Temperature Measurement in Substrate Processing Apparatus

Figure 5:
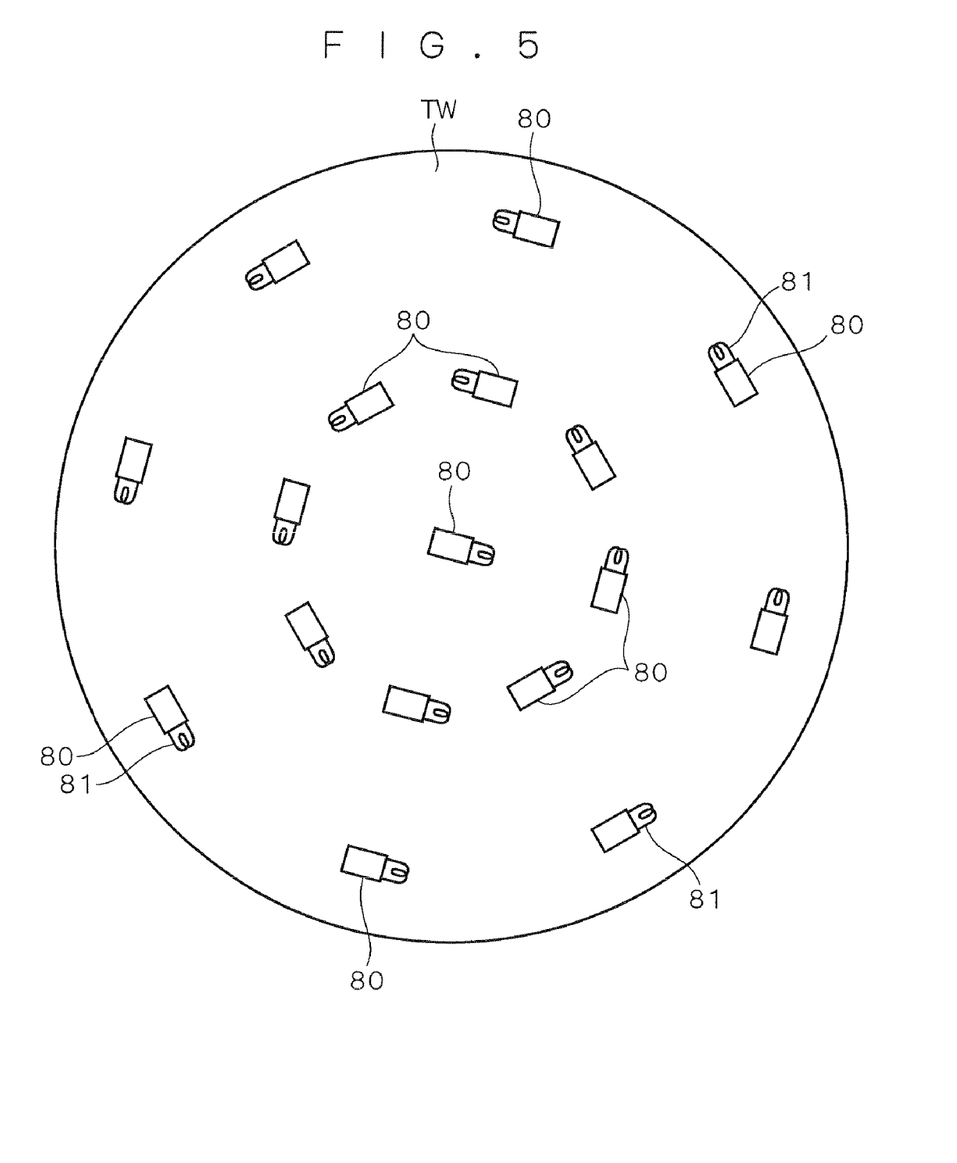
FIG. 5 is a plan view of a temperature-measurement substrate for use in substrate-temperature measurement in the substrate processing apparatus in FIG. 1.

The next description is about substrate-temperature measurement in the substrate processing apparatus 1. FIG. 5 is a plan view of a substrate for temperature measurement (hereinafter referred to as a "temperature-measurement substrate") TW for use in substrate-temperature measurement in the substrate processing apparatus 1. The temperature-measurement substrate TW is made of the same material and of the same size as other normally processed semiconductor substrates W In the present embodiment, it is a disc-shaped substrate of silicon with a diameter of 300 mm.

The temperature-measurement substrate TW has a plurality of (17, in the present embodiment) temperature-measuring elements 80 mounted therein. The temperature-measuring elements 80 are mounted in recesses formed in the surface of the temperature-measurement substrate TW. As shown in FIG. 5, one of the temperature-measuring elements 80 is mounted in the center of the temperature-measurement substrate TW; another eight of the temperature-measuring elements 80 are mounted at intervals of 45 degrees on the circumference of a circle with a radius of 140 mm; and the other eight of the temperature-measuring elements 80 are mounted at intervals of 45 degrees on the circumference of a circle with a radius of 280 mm.

Figure 9:
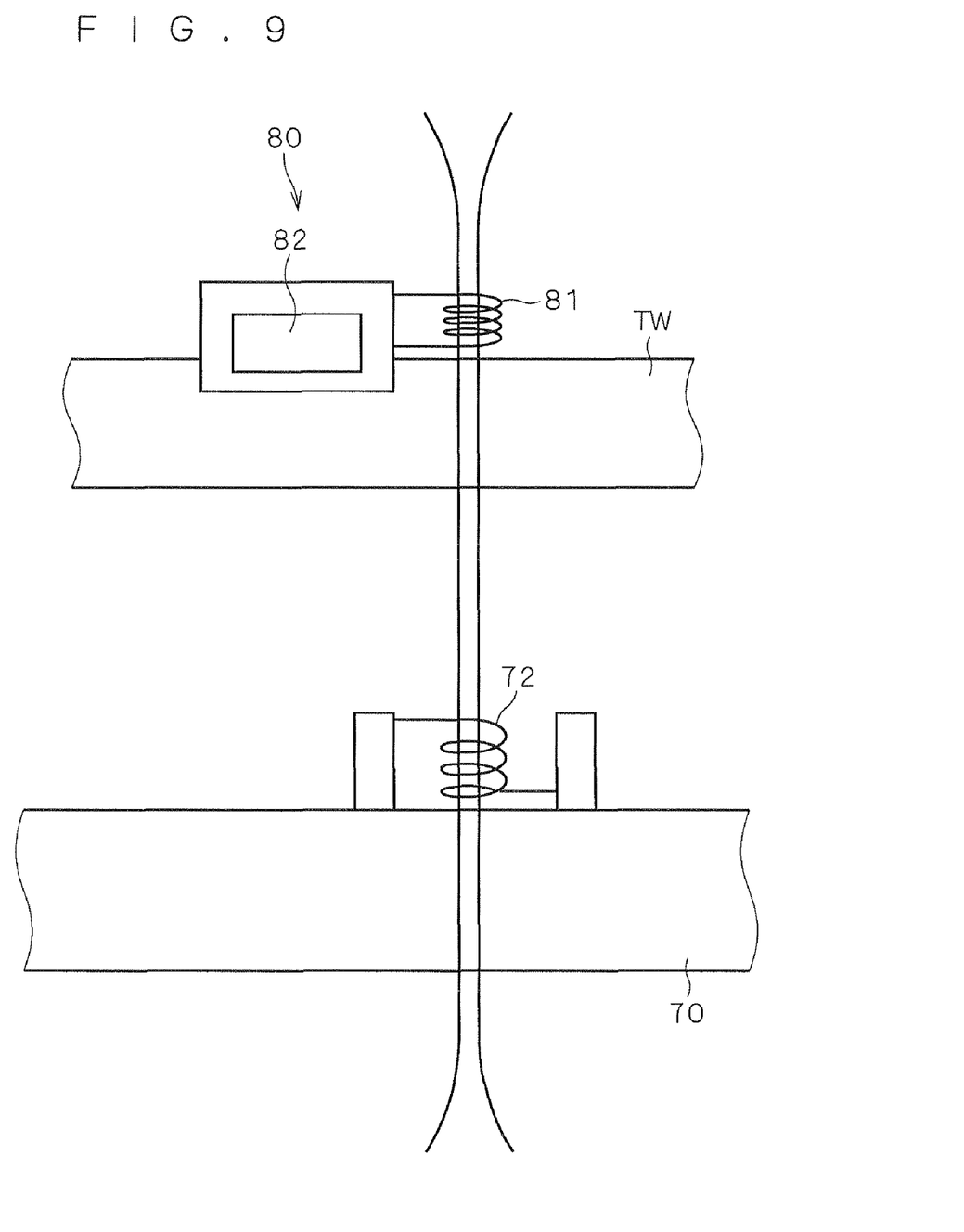
FIG. 9 shows the relative positions of a temperature-measuring element and a sensor coil.

Each of the temperature-measuring elements 80 is configured by connecting a coil 81 to a package including a built-in quartz resonator 82 (cf. FIG. 9). The package may be made of a ceramic or a metal. Quartz crystals have different characteristic frequencies and a wide variety of temperature characteristics depending on their cut angles, out of which what is called Ys-cut quartz crystals have high rates of change of transmit/receive frequencies with respect to temperature. Sending an electrical signal with a frequency equivalent to the characteristic frequency of a quartz resonator 82 to the quartz resonator 82 and then measuring the frequency of the electrical signal received from the quartz resonator 82 after the termination of the signal transmission enable computation of the temperature of the temperature-measuring element 80 based on the rate of change of the transmit/receive frequencies. The use of quartz resonators, as compared with the use of resistance thermometer sensors or the like, achieves higher-precision temperature measurement.

As previously described above, the substrate rests PASS1 to PASS6 are provided in connecting portions of the adjacent blocks in the substrate processing apparatus 1 and they are used for transfer of substrates W between the transport robots of those adjacent blocks. The substrate rests PASS7 and PASS8, although provided in the heat-treatment tower 43 in the development block 40, are also used for transfer of substrates W between the transport robots TR3 and TR4. The substrate rests PASS9 and PASS10, although provided inside the interface block 50, are also used for transfer of substrates W between the transport robot TR4 and the transport mechanism IFR. In other words, all the substrate rests PASS1 to PASS10 are for use in transfer of substrates W between two transport robots (including the indexer robot IR and the transport mechanism IFR) that transport substrates W to a plurality of substrate transfer positions. The "substrate transfer positions" include, in addition to the processing units and the substrate rests, the carriers C, the return buffer RBF, the send buffer SBF, and they are used to collectively refer to access points of the transport robots.

Figure 6:
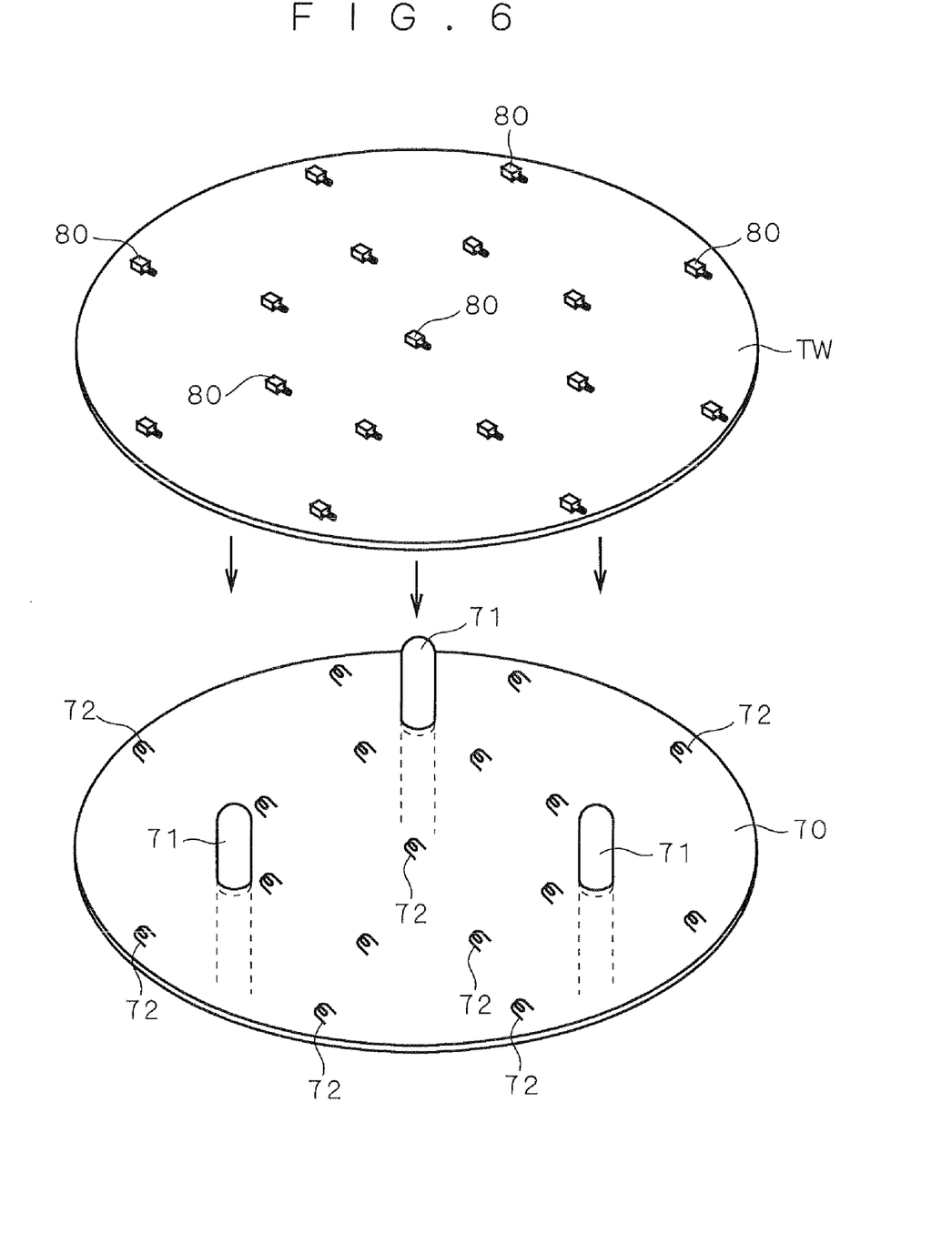
FIG. 6 is a perspective view of a sensor plate and a temperature-measurement substrate placed thereon in a substrate rest.
Figure 7:
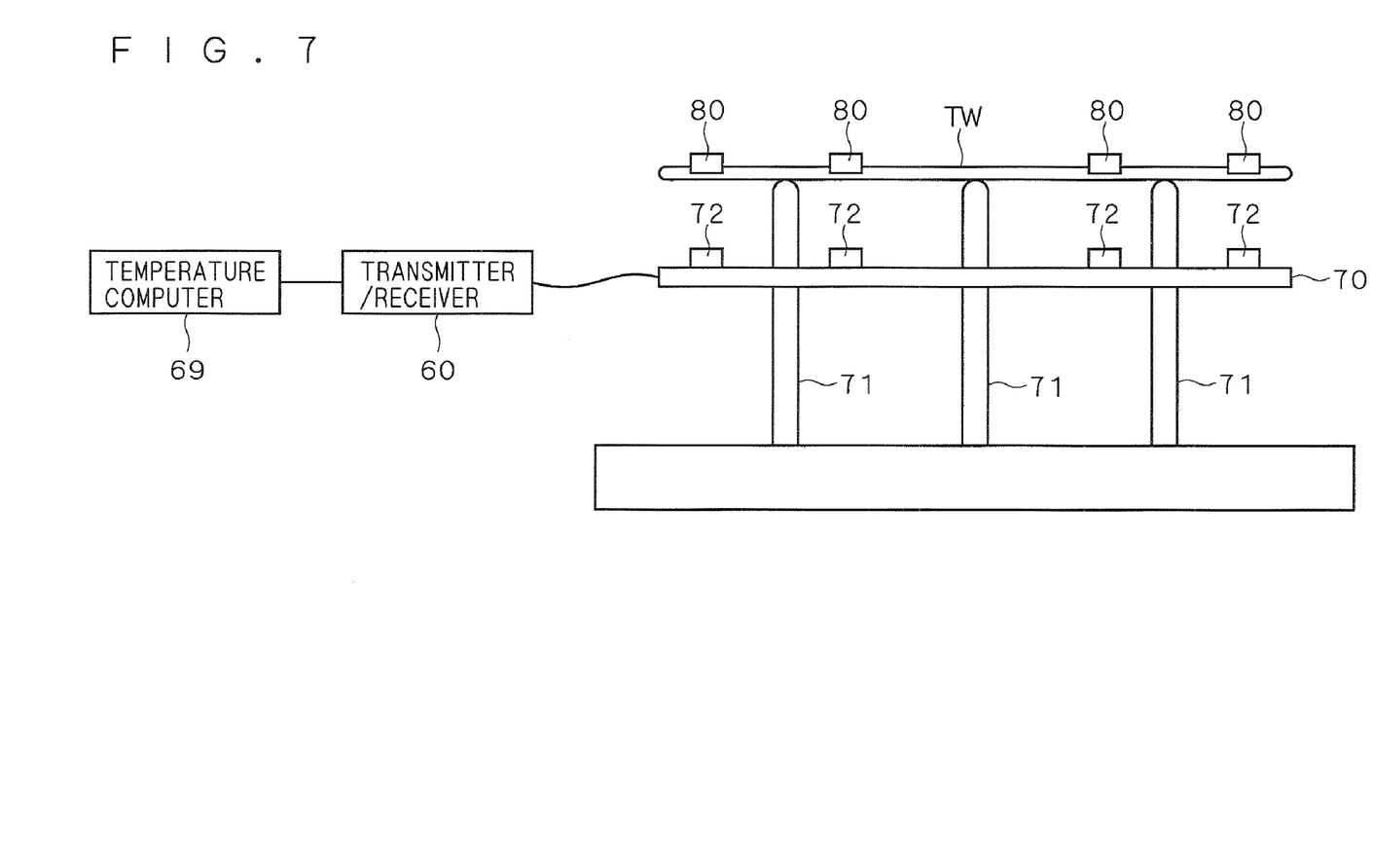
FIG. 7 illustrates an overall configuration of a temperature-measuring system including a sensor plate and a temperature-measurement substrate.

In the present embodiment, each of the substrate rests PASS1 to PASS10 is provided with a sensor plate 70. While in the following description, the substrate rest PASS3 is taken as an example for explaining the temperature-measuring system in the substrate processing apparatus 1, the same applies to the other substrate rests. FIG. 6 is a perspective view of the sensor plate 70 and the temperature-measurement substrate TW placed thereon in the substrate rest PASS3. FIG. 7 illustrates an overall configuration of the temperature-measuring system including a sensor plate 70 and a temperature-measurement substrate TW; and FIG. 8 is a principal configuration of the temperature-measuring system.

The substrate rest PASS3 includes three support pins 71 by which a substrate W is supported. The temperature-measurement substrate TW, which is of the same configuration and of the same size as normally processed substrates W, is also placed on the substrate rest PASS3 while supported by the three support pins 71. The sensor plate 70 is a disc-shaped member having approximately the same diameter as the temperature-measurement substrate TW and spans over the three support pins 71 of the substrate rest PASS3. The sensor plate 70 has on the upper surface a plurality of, more specifically, the same number (17, in the present embodiment) of sensor coils 72 as the temperature-measuring element 80 in the temperature-measurement substrate TW. The level at which the sensor plate 70 is provided, i.e., the distance from the top ends of the support pins 71 to the sensor plate 70, can be arbitrary as long as radio transmission between the sensor coils 72 and the temperature-measuring elements 80 are possible and the substrate rest PASS3 is accessible from the transport robots TR1 and TR2.

When the temperature-measurement substrate TW is placed in position on the three support pins 71, the 17 sensor coils 72 are in such positions as to face the coils 81 of the temperature-measuring elements 80. As shown in FIG. 9, each of the sensor coils 72 is so provided that its axial center is in line with the axial center of the coil 81 of the facing temperature-measuring element 80 (in the vertical direction, in the present embodiment). The sensor coils 72 may be air-core coils, printed coils, or the like.

Figure 8:
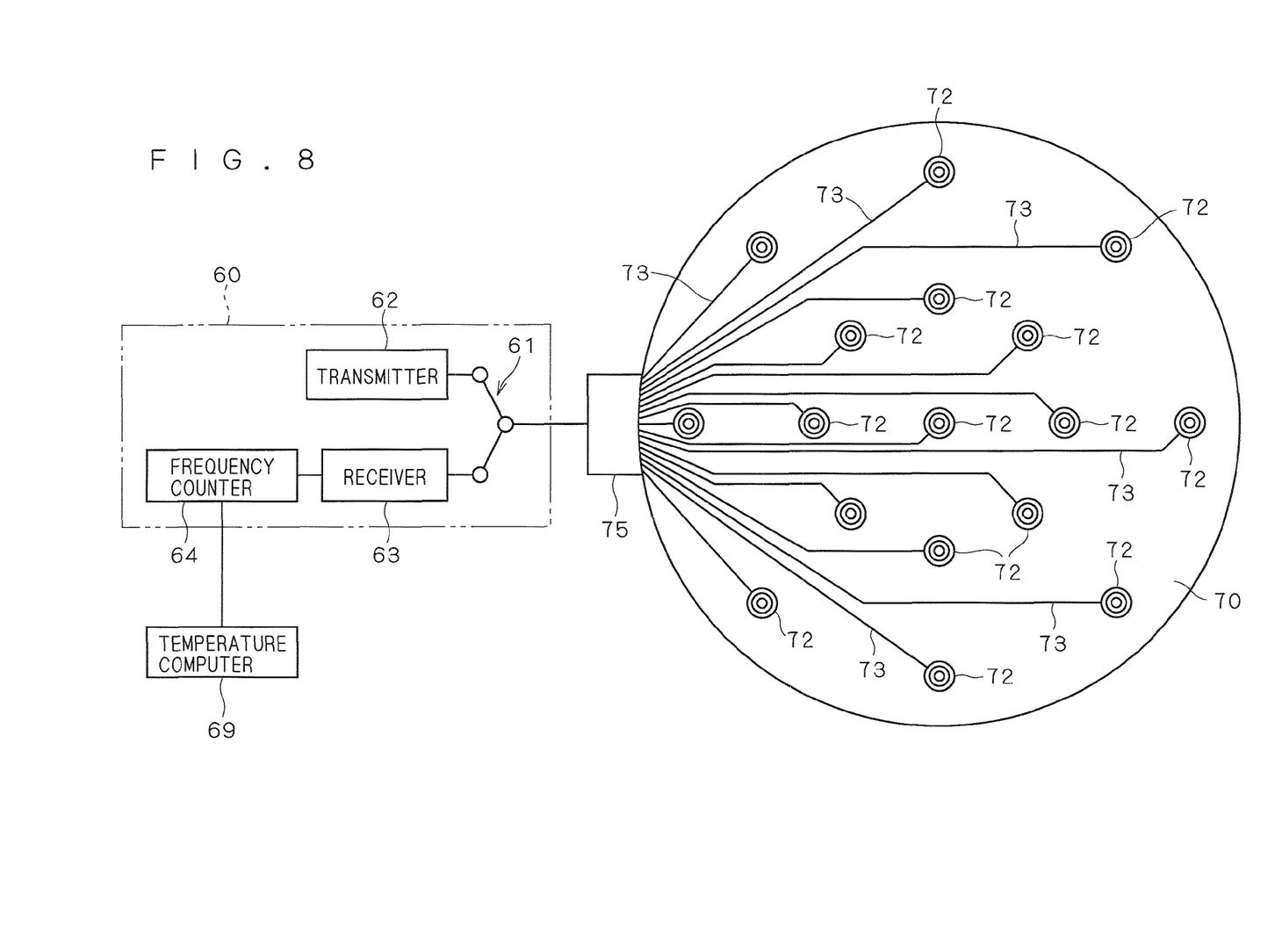
FIG. 8 illustrates a principal configuration of the temperature-measuring system in FIG. 7.

As shown in FIGS. 7 and 8, the 17 sensor coils 72 on the sensor plate 70 are individually connected (wire-connected) to the transmitter-receiver 60 through interconnect lines 73. Specifically, each of the 17 sensor coils 72 has an interconnect line 73 connected thereto, and the 17 interconnect lines 73 collect at an output terminal 75 provided at an edge portion of the sensor plate 70 and are connected in parallel to the transmitter-receiver 60.

The transmitter-receiver 60 includes a selector 61, a transmitter 62, a receiver 63, and a frequency counter 64 (FIG. 8). The selector 61 selects where to connect each temperature-measuring element 80 by switching between the transmitter 62 and receiver 63. The transmitter 62 transmits an electrical signal with a given frequency through the sensor coils 72 to the quartz resonators 82 of the 17 temperature-measuring elements 80. The receiver 63 receives electrical signals from the quartz resonators 82 of the 17 temperature-measuring elements 80 through the sensor coils 72. The receiver 63 is connected to a frequency counter 64 which measures the frequencies of electrical signals received by the receiver 63.

The frequency counter 64 is further connected to a temperature computer 69. The temperature computer 69 computes the temperature of the temperature-measurement substrate TW based on the frequencies of electrical signals measured by the frequency counter 64. The transmitter-receiver 60 and the temperature computer 69 may be controlled by a controller (not shown) provided in the substrate processing apparatus 1.

The substrate processing apparatus 1 measures the temperature of a substrate in the following way. First, the transport of a temperature-measurement substrate TW is started at an appropriate time during the course of the above-described series of photolithographic processes on normally processed substrates W. Here, the temperature-measurement substrate TW is transported to the processing units through the same procedure as the above-described photolithographic processes. In the heat-treatment units, the same heat treatment as performed on normally processed substrates W is performed on the temperature-measurement substrate TW. However, since the temperature-measurement substrate TW has the temperature-measuring elements 80 mounted therein, the supply of liquids in the liquid-processing units should preferably be omitted. Since the liquid-processing units have little influence on the substrate temperature, even without the supply of liquids, the temperature-measurement substrate TW will have a similar temperature history to normally processed substrates W. The timing of insertion of the temperature-measurement substrate TW should preferably be between lots.

In the course of sequential transport of the temperature-measurement substrate TW, the temperature-measurement substrate TW is also placed on the substrate rests PASS1 to PASS10. When transported from the BARC block 20 to the resist-coating block 30, the temperature-measurement substrate TW is placed on the substrate rest PASS3 by the transport robot TR1. When the temperature-measurement substrate TW is placed in position on the support pins 71 of the substrate rest PASS3, the 17 temperature-measuring elements 80 in the temperature-measurement substrate TW and the 17 sensor coils 72 on the sensor plate 70 are in such positions as to face each other in close proximity and in a one-to-one correspondence. Both the axial directions of the sensor coils 72 and the coils 81 of the temperature-measuring elements 80 are the vertical direction, so that, when the temperature-measurement substrate TW is placed in position on the substrate rest PASS3, as shown in FIG. 9, the axial centers of the sensor coils 72 agree with those of the coils 81.

Under this condition, the selector 61 switches to the transmitter 62 which then is connected to the sensor coils 72. The transmitter 62 then transmits an electrical signal with a frequency corresponding to the characteristic frequency of the quartz resonators 82 of the 17 temperature-measuring elements 80 on the temperature-measurement substrate TW. This causes the sensor coils 72 to send out a transmission wave corresponding to the characteristic frequency of the quartz resonators 82 to the temperature-measuring elements 80. The frequency of the electrical signal transmitted from the transmitter 62 is also transmitted from the transmitter 62 to the temperature computer 69.

The electrical signal transmitted from the transmitter 62 is broadcasted as a transmission wave from the 17 sensor coils 72 to the temperature-measuring elements 80. The transmission wave is received by the coils 81 of the 17 temperature-measuring elements 80 on the temperature-measurement substrate TW, and as a result, the 17 quartz resonators 82 resonate almost at the same time. The transmission from the transmitter 62 is thereafter stopped so that the transmission of electrical signals is stopped, and then the selector 61 switches to the receiver 63.

Stopping the transmission of electrical signals causes damped oscillations of the above-described 17 resonating quartz resonators 82 at frequencies corresponding to the temperature of the temperature-measurement substrate TW (precisely, the temperatures of the temperature-measurement substrate TW at positions where the quartz resonators 82 are mounted). Then, electrical signal caused by these damped oscillations are transmitted from the quartz resonators 82. An electrical signal transmitted from each of the quartz resonator 82 is outputted from the coil 81 of the corresponding temperature-measuring element 80 as an electromagnetic wave, which then is received by the sensor coil 72 that faces the coil 81.

The receiver 63 receives electrical signals transmitted from the 17 quartz resonators 82 individually and almost simultaneously through the coils 81 and the sensor coils 72. The frequency counter 64 individually measures the frequencies of the electrical signals received from the 17 quartz resonators 82 and transmits the measured values to the temperature computer 69. Based on the frequencies of the electrical signals measured by the frequency counter 64 and the frequency of the sent-out electrical signal transmitted from the transmitter 62, the temperature computer 69 computes the rate of change of transmit-receive frequencies, and using that rate of change, individually computes the temperatures of the temperature-measurement substrate TW at positions where the 17 quartz resonator 82 are mounted.

In the way described above, the temperature of a substrate placed on the substrate rest PASS3 can be measured with the use of the temperature-measurement substrate TW. The temperatures of substrates placed on the other substrate rests PASS1, PASS2, and PASS4 to PASS10 can also be measured in the same way. Since the temperature-measurement substrate TW is transported in sequence to each processing unit through the same procedure as normally processed substrates W, it is conceivable that the temperature of the temperature-measurement substrate TW placed on each of the substrate rests PASS1 to PASS10 will be the same as the temperatures of practically processed substrates W placed on each of the substrate rests PASS1 to PASS10. In other words, the temperature of a substrate W being processed can be measured in real time by measuring the temperature of the temperature-measurement substrate TW placed on each of the substrate rests PASS1 to PASS10. Besides, since the temperature measurement with the temperature-measurement substrate TW utilizes the quartz resonators 82, it is carried out with very high precision. Accordingly, the temperature of a substrate W being processed can be measured in real time with high precision.

Unlike in conventional cases, it is thus unnecessary to process an actual substrate over and over in order to derive proper processing conditions; proper processing conditions can be readily derived from the temperature measurement with the temperature-measurement substrate TW.

Since the temperature of a substrate W being processed can be measured in real time, performing the substrate temperature measurements with the temperature-measurement substrate TW at appropriate times during intervals in the course of processing normal substrates W allows early detection of the possible occurrence of processing problems, thereby allowing prediction of problems or the like in the processing units.

Further, feedback and feedforward control on heat treatments before and after measurements are possible based on the results of measurements of substrate temperatures. For instance, when the result of the temperature measurement of the temperature-measurement substrate TW in the substrate rest PASS3 is higher than a desired value, the cooling time in the cooling units CP in the heat-treatment towers 22 and 23 after baking of anti-reflection film is considered too short. In this case, control is used to increase the cooling time in the cooling units CP in the heat-treatment towers 22 and 23 or to increase the temperature-control time before resist coating in the cooling units CP in the heat-treatment towers 32 and 33, so that resist coating is carried out at preset temperatures.

Even for preparation of a new processing recipe (which is a description of a procedure and conditions for processing substrates W), the real-time temperature measurement of a substrate W being processed allows speedy correction of the recipe, thus allowing a short-time preparation of a final recipe.

The provision of the sensor plates 70 for substrate-temperature measurement in the substrate rests PASS1 to PASS10 of a relatively simple configuration reduces complexity of the configuration of the substrate processing apparatus 1, as compared with the provision of temperature-measuring mechanisms in the processing units. This prevents adverse effects on the processes and allows easy maintenance.

While one embodiment of the invention has been described so far, various modifications are possible without departing from the scope of the invention. For instance, while in the embodiment described above, each of the substrate rests PASS1 to PASS10 are provided with a sensor plate 70 with sensor coils 72, the run-in table 91 and/or the run-out table 92 in the exposure unit EXP may be provided with a sensor plate 70. The run-in table 91 and the run-out table 92 are equivalent to substrate transfer parts that transfer substrates W between the transport mechanism IFR and a transport mechanism (transport robot) in the exposure unit EXP. Such provision will allow real-time temperature measurements of substrates W before and after exposure.

While in the embodiment described above, the sensor coils 72 are provided via the sensor plate 70 in each of the substrate rests PASS1 to PASS10, they may be provided via any suitable material, such as for example a support rod, other than the sensor plates 70, in the substrate rests PASS1 to PASS10. It should, however, be noted that the sensor coils 72 need to be located in such positions that allow radio transmission and reception to and from the temperature-measuring elements 80 on the temperature-measurement substrate TW placed on the substrate rests PASS1 to PASS10 and that brook no interference with the transport robots.

The sensor coils 72 do not need to be installed in the substrate rests PASS1 to PASS10. If any space is available for installation, the sensor coils 72 may be installed in the processing units. However, if the sensor coils 72 are installed in the substrate rests PASS1 to PASS10 as in the embodiment described above, then a temperature-measuring system can be built with great ease by only providing the sensor plates 70 with the sensor coils 72. This improves measurement accuracy and avoids troubles accompanying the installation of sensor coils 72 in the processing units.

While in the embodiment described above, the 17 temperature-measuring elements 80 are mounted in the temperature-measurement substrate TW, the number and locations of temperature-measuring elements 80 may be arbitrary. For example, 32 or 64 temperature-measuring elements 80 may be mounted in a single temperature-measurement substrate TW. The temperature-measurement substrate TW may have a diameter of 200 mm.

The temperature-measuring elements 80 are not limited to those formed by connecting the coils 81 to the packages including the built-in quartz resonators 82. They may be formed by connecting various antennas to the quartz resonators 82.

The configuration of the substrate processing apparatus according to this embodiment is not limited to the one illustrated in FIG. 1 to 4, and various device configurations can be employed as long as they include a substrate transfer part for transfer of substrates W between transport robots. The processing blocks constituting the substrate processing apparatus may include those for cleaning and ashing.

While a particular embodiment has been shown and described in detail, the foregoing description is in all aspects illustrative and not restrictive. It is therefore understood that numerous modifications and variations can be devised without departing from the scope of the invention.

What is claimed is:

1. A substrate processing apparatus performing given processing on a substrate, the substrate processing apparatus comprising:
    a plurality of processing blocks provided in series in one direction and each including a processing unit performing processing on a substrate and a transport robot transporting a substrate to the processing unit;
    a substrate rest which is provided in a connecting portion of the plurality of processing blocks and on which the substrate is placed for transfer of the substrate between the transport robots of each adjacent pair of the plurality of processing blocks;
    a sensor coil provided in the substrate rest and for use in radio transmission and reception to and from a temperature-measuring element that is formed by connecting a coil or antenna to a quartz resonator;
    a transmitter-receiver that, once a temperature-measurement substrate with the temperature-measuring element is placed on the substrate rest, transmits a transmission wave to the temperature-measuring element through the sensor coil, and after stopping the transmission of the transmission wave, receives an electromagnetic wave from the temperature-measuring element through the sensor coil; and
    a temperature computer for computing a temperature of the temperature-measurement substrate based on the frequency of the electromagnetic wave that the transmitter-receiver receives from the temperature-measuring element.

2. The substrate processing apparatus according to claim 1 wherein
    the substrate rest includes a plurality of support pins for use in placement of a substrate, and
    the sensor coil is annexed to the plurality of support pins.

3. The substrate processing apparatus according to claim 2 further comprising a sensor plate spanning over the plurality of support pins, wherein the sensor coil is provided on an upper surface of the sensor plate.

4. The substrate processing apparatus according to claim 1 further comprising an indexer block connected to one end of a series of the plurality of processing blocks and receiving an unprocessed substrate transported from the outside and transporting a processed substrate to the outside, wherein another sensor coil is provided in a substrate rest provided in a connecting portion between the indexer block and the series of the plurality of processing blocks.

5. The substrate processing apparatus according to claim 4 wherein the plurality of processing blocks includes a resist-coating block applying a photoresist on a substrate and a developing block performing development on a substrate,
    the substrate processing apparatus further comprising:
    an interface block provided between the other end of the series of the plurality of processing blocks and an exposure unit that performs an exposure process on a substrate, the interface block transferring a photoresist-coated substrate to the exposure unit and receiving an exposed substrate from the exposure unit, wherein
    another sensor coil is provided in a substrate rest that is provided for transfer of a substrate between the interface block and the series of the plurality of processing blocks.

6. The substrate processing apparatus according to claim 5 wherein another sensor coil is provided in a substrate rest that is provided for transfer of a substrate between the interface block and the exposure unit.

7. The substrate processing apparatus according to claim 1 wherein the transmitter-receiver includes:
    a transmitter for transmitting an electrical signal with a frequency corresponding to a characteristic frequency of the quartz resonator;
    a receiver for receiving an electromagnetic wave transmitted from the quartz resonator; and
    a selector for switching between the transmitter and the receiver to select where to connect the sensor coil.

8. The substrate processing apparatus according to claim 7 wherein the transmitter-receiver includes a frequency counter measuring a frequency of the electromagnetic wave that the receiver receives from the quartz resonator.

9. A substrate processing apparatus performing given processing on a substrate, the substrate processing apparatus comprising:

first and second transport robots each transporting a substrate to a plurality of substrate transfer positions;
a substrate rest on which a substrate is placed for transfer of the substrate between the first and second transport robots;
a sensor coil provided in the substrate rest and for use in radio transmission and reception to and from a temperature-measuring element that is formed by connecting a coil or antenna to a quartz resonator;
a transmitter-receiver that, once a temperature-measurement substrate with the temperature-measuring element is placed on the substrate rest, transmits a transmission wave to the temperature-measuring element through the sensor coil, and after stopping the transmission of the transmission wave, receives an electromagnetic wave from the temperature-measuring element through the sensor coil; and
a temperature computer for computing a temperature of the temperature-measurement substrate based on a frequency of the electromagnetic wave that the transmitter-receiver receives from the temperature-measuring element.

10. The substrate processing apparatus according to claim 9 wherein:
the substrate rest includes a plurality of support pins for use in placement of a substrate, and
the sensor coil is annexed to the plurality of support pins.

11. The substrate processing apparatus according to claim 10 further comprising a sensor plate spanning over the plurality of support pins, wherein the sensor coil is provided on an upper surface of the sensor plate.

12. The substrate processing apparatus according to claim 9 wherein
the transmitter-receiver includes:
a transmitter for transmitting an electrical signal with a frequency corresponding to a characteristic frequency of the quartz resonator;
a receiver for receiving an electromagnetic wave transmitted from the quartz resonator; and
a selector for switching between the transmitter and the receiver to select where to connect the sensor coil.

13. The substrate processing apparatus according to claim 12 wherein
the transmitter-receiver includes a frequency counter measuring the frequency of the electromagnetic wave that the receiver receives from the quartz resonator.

* * * * *